United States Patent [19]
Shiono et al.

[11] Patent Number: 5,402,435
[45] Date of Patent: Mar. 28, 1995

[54] OPTICAL DEVICE

[75] Inventors: Teruhiro Shiono, Osaka; Hisahito Ogawa, Nara, both of Japan

[73] Assignee: Matsushita Electric Industrial Co., Ltd., Kadoma, Japan

[21] Appl. No.: 206,754

[22] Filed: Mar. 7, 1994

[30] Foreign Application Priority Data

Mar. 5, 1993 [JP] Japan .................................. 5-044833

[51] Int. Cl.6 .............................................. H01S 3/19
[52] U.S. Cl. ........................................ 372/43; 372/50; 372/36
[58] Field of Search .................. 372/43, 36, 34, 50

[56] References Cited

U.S. PATENT DOCUMENTS 4,367,483 1/1983 Takahashi et al. ..................... 372/50

FOREIGN PATENT DOCUMENTS

| 0392714 | 10/1990 | European Pat. Off. | 372/43 |
| 0211980 | 9/1987 | Japan | 372/43 |
| 63-228790 | 9/1988 | Japan . | |
| 64-24488 | 1/1989 | Japan . | |
| 0030192 | 1/1990 | Japan | 372/43 |
| 0081493 | 3/1990 | Japan | 372/43 |
| 3-187287 | 8/1991 | Japan . | |
| 4-219640 | 8/1992 | Japan . | |

*Primary Examiner*—Georgia Y. Epps
*Attorney, Agent, or Firm*—Ratner & Prestia

[57] ABSTRACT

An optical device of this invention includes; a semiconductor laser chip having an emitting end face for emitting laser light; a transparent substrate, allowing the laser light to transmit therethrough, having a first surface, and having a second surface facing the first surface; and a silicon substrate, located above the transparent substrate, having an oblique surface inclined with respect to the second surface, and having a parallel surface parallel to the second surface; wherein the semiconductor laser chip is located on the oblique surface of the silicon substrate; and the laser light emitted from the semiconductor laser chip propagates through the transparent substrate in a zigzag manner between the first surface and the second surface.

20 Claims, 6 Drawing Sheets

OPTICAL DEVICE

BACKGROUND OF THE INVENTION

1. Field of the Invention

The present invention relates to a plate type integrated optical device using a zigzag optical path, and particularly to an optical device in which an oblique incident angle of a semiconductor laser chip can accurately be set.

2. Description of the Related Art

In an integrated optical device having a plate shape (plate type optical integrated circuit), optical elements are integrated on a transparent plate (substrate), an optical path is formed in a zigzag manner by utilizing reflections between the interfaces of the plate so that the optical elements are connected with each other, and optical information processing is conducted. This circuit configuration has been utilized because it can allow an optical application system to be miniaturized, stabilized, and lightened.

FIGS. 6A and 6B show an example of an optical device using a conventional plate type optical integrated circuit system (Teruhiro Shiono et al., Japanese patent application No. 3-77527).

The optical device shown in FIGS. 6A and 6B, is an example of an optical head for reading out signals from an optical recording device such as a compact disk (CD), an optical disk, or an optical card memory.

In the conventional optical device, light which is obliquely emitted from a semiconductor laser chip 1 disposed on the back face of a transparent substrate 2 travels as propagation light 8 and enters a reflection collimator lens 3' to be reflected and collimated. The collimated light propagates in a zigzag manner, and then is obliquely converged and is output to an optical disk 7 as emitted light 9 by a transmission objective lens 4a disposed on the surface of the transparent substrate 2. Light 10 reflected from the optical disk 7 enters a second transmission objective lens 4b disposed on the surface of the transparent substrate 2, and is collimated to become propagation light 8'. The propagation light 8' propagates in a zigzag manner and enters a reflection twin lens 5' which is a signal detecting element (focus/track error signal detection means) formed on the surface of the transparent substrate 2. The propagation light 8' is split into two parts by the lens 5' and converged into a four-split optical detector 6 disposed on the back face of the transparent substrate 2. The four-split optical detector 6 outputs signals corresponding to the input light. The signals output from the optical detector 6, are a reproduced signal, a focus error signal, and a track error signal, both the focus error signal and the track error signal are positioning signals.

In the conventional optical head shown in FIGS. 6A and 6B, since the semiconductor laser chip is directly disposed on the back face of the substrate, it is difficult to accurately adjust the oblique incident angle. In addition, since the heat sink is realized mainly by a glass substrate, the heat conduction is not good. Therefore, there arises problems in that the output power of the semiconductor laser chip is reduced and that a high power laser cannot be used.

This invention has been conducted in view of these problems, and provides an optical head in which an incident angle of a laser light emitted from a semiconductor laser chip can easily be set, which is free from the reduction of the output power of the semiconductor laser chip, and in which a high power laser can be used.

SUMMARY OF THE INVENTION

The optical device of this invention comprises: a semiconductor laser chip having an emitting end face for emitting laser light; a transparent substrate, allowing the laser light to transmit therethrough, having a first surface, and having a second surface facing the first surface; and a substrate, located above the transparent substrate, having an oblique surface inclined with respect to the second surface, and having a parallel surface parallel to the second surface; wherein the semiconductor laser chip is located on the oblique surface of the substrate; and the laser light emitted from the semiconductor laser chip propagates through the transparent substrate in a zigzag manner between the first surface and the second surface.

In one embodiment of the invention, the substrate is made of silicon.

In another embodiment of the invention, the substrate is located directly on the transparent substrate.

In another embodiment of the invention, the optical device further comprises a light detector formed on the parallel surface of the silicon substrate, wherein the light detector detects the laser light propagated through the transparent substrate, and generates an electric signal corresponding to the detected laser light.

In another embodiment of the invention, the optical device further comprises; a first optical element, formed on the transparent substrate, for collimating and reflecting the laser light; a second optical element, formed on the transparent substrate, for converging the laser light collimated by the first optical element on an object which exists outside the transparent substrate; a third optical element, formed on the transparent substrate, for converging the laser light reflected by the object on the light detector; and a reflective layer, formed on the transparent substrate, for reflecting the laser light.

In another embodiment of the invention, the parallel surface of the substrate has a first portion being in contact with the second surface of the transparent substrate, and has a second portion not being in contact with the second surface, and terminal pads, for outputting the electric signal generated by the light detector, are formed on the second portion of the parallel surface.

In another embodiment of the invention, the object is an optical recording medium.

In another embodiment of the invention, the distance between the first surface and the second surface of the transparent substrate is 500 or more times the wavelength of the laser light.

In another embodiment of the invention, the width of the transparent substrate is 500 or more times the wavelength of the laser light.

In another embodiment of the invention, the oblique surface of the substrate is formed by anisotropic etching.

In another embodiment of the invention, the substrate is made of a single-crystal silicon having a (100) plane, and the parallel surface of the substrate includes the (100) plane.

In another embodiment of the invention, the emitting end face of the semiconductor laser chip is located apart from the second surface of the transparent substrate by a prescribed distance.

In another embodiment of the invention, the oblique surface of the substrate is inclined at 35.3° to a surface perpendicular to the second surface of the transparent substrate.

In another embodiment of the invention, the substrate includes a concave portion having a inverted pyramid-like shape and having an opening which faces the second surface of the transparent substrate, and the oblique surface of the substrate is a portion of the concave portion.

In another embodiment of the invention, the concave portion of the substrate is formed by anisotropic etching.

In another embodiment of the invention, the substrate is disposed on an opposite side of the reflective layer with respect to the transparent substrate.

In another embodiment of the invention, the reflective layer has an opening through which the laser light emitted from the semiconductor laser chip passes.

According to another aspect of the invention, the optical device comprises: a semiconductor laser chip having an emitting end face for emitting laser light; a transparent substrate, allowing the laser light to transmit therethrough, having a first surface, a second surface facing the first surface, and a third surface substantially perpendicular to the second surface; and a silicon substrate, located on the transparent substrate, having an oblique surface inclined with respect to the third surface, and having a parallel surface parallel to the third surface; wherein the oblique surface of the silicon substrate is formed by anisotropic etching; the semiconductor laser chip is located on the oblique surface of the silicon substrate; and the laser light emitted from the semiconductor laser chip propagates through the transparent substrate in a zigzag manner between the first surface and the second surface.

According to another aspect of the invention, the optical device comprises: a semiconductor laser chip having an emitting end face for emitting laser light; a transparent substrate, allowing the laser light to transmit therethrough, having a first surface and a second surface facing the first surface; a silicon substrate, located on the transparent substrate, having an oblique surface inclined with respect to the second surface, and having a parallel surface parallel to the second surface; and a light detector formed on the parallel surface of the silicon substrate, for detecting the laser light propagated through the transparent substrate, and for generating an electric signal corresponding to the detected laser light, wherein the oblique surface of the silicon substrate is formed by anisotropic etching; the semiconductor laser chip is located on the oblique surface of the silicon substrate; and the laser light emitted from the semiconductor laser chip propagates through the transparent substrate in a zigzag manner between the first surface and the second surface.

According to another aspect of the invention, the optical device comprises: a semiconductor laser chip having an emitting end face for emitting laser light; a transparent substrate, allowing the laser light to transmit therethrough, having a first surface, and having a second surface facing the first surface; a light detector for detecting the laser light and generating an electric signal corresponding to the detected laser light; a silicon substrate, located on the transparent substrate, having an oblique surface inclined with respect to the second surface, and having a parallel surface parallel to the second surface; and a first optical element, formed on the first surface of the transparent substrate, for collimating and reflecting the laser light; a second optical element, formed on the first surface of the transparent substrate, for converging the laser light collimated by the first optical element on an object which exists outside the transparent substrate; a third optical element, formed on the first surface of the transparent substrate, for converging the laser light reflected by the object on the light detector; and a reflective layer, formed on the second surface of the transparent substrate, for reflecting the laser light, wherein the semiconductor laser chip is located on the oblique surface of the silicon substrate; and the light detector is formed on the parallel surface of the silicon substrate.

It is known that, in a silicon crystal, an oblique face can be formed by anisotropic etching with excellent reproducibility. According to the invention, a semiconducor laser chip is disposed on an oblique face which is formed by anisotropic etching of a silicon crystal. Therefore, it is possible to accurately set the oblique emission angle of the semiconductor laser chip. Since the heat conductivity of silicon is superior by two orders of magnitude than that of glass, the heat of the semiconductor laser chip can efficiently be dissipated so that the semiconductor laser chip is free from the reduced power trouble and a high power laser can be used.

Thus, the invention described herein makes possible the advantages of (1) providing an optical device in which the incident angle of the laser light emitted from the semiconductor laser chip can accurately be set, (2) providing an optical device which is free from reduction of the output power of the semiconductor laser chip, and (3) providing an optical device in which a high power laser can be used.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1A:
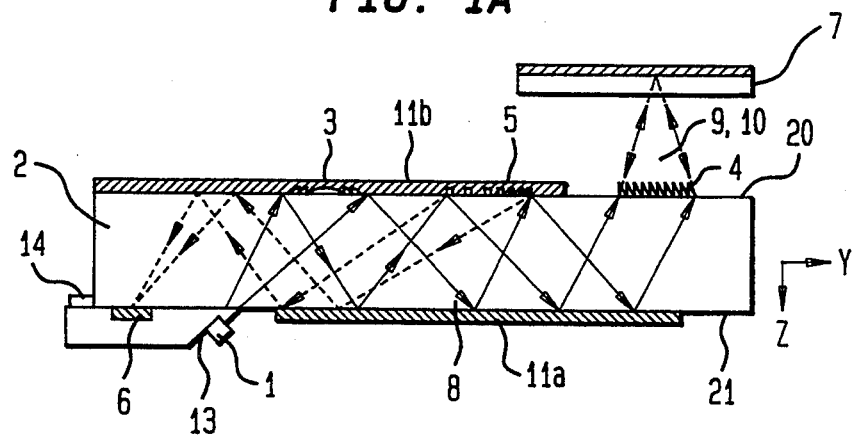
FIG. 1A is a cross-sectional view showing the construction of the first example of this invention, and illustrating the propagation and the convergence of the laser light in the first example.
Figure 1B:
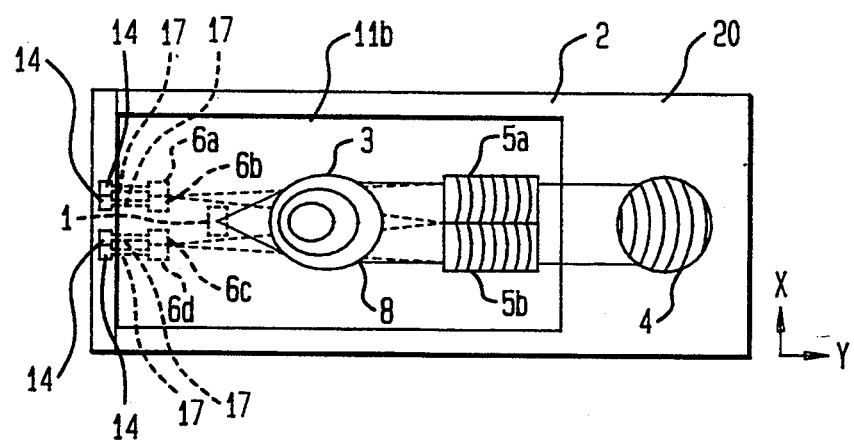
FIG. 1B is a top view of the first example of this invention, showing the construction of the first example, and illustrating the propagation and the convergence of the laser light in the first example.

An optical device of a first example according to the invention will be described with reference to FIGS. 1A, 1B, 2A, and 2B. The optical device of the first example of the invention is an optical head for reading out signals from an optical recording device such as a compact disk (CD), an optical disk, an optical card memory, or the like.

The first example comprises a semiconductor laser chip 1 having an emitting end face for emitting laser light 8, and a transparent substrate 2 having a surface 20 and a back face 21 facing the surface 20.

A glass plate of, for example, BK7, having a thickness (a size in the z direction) of 3 mm, a width (a size in the x direction) of 5 mm, and a length (a size in the y direction) of 10 mm, is used as a transparent substrate 2. Reflective layers 11b and 11a are formed on the surface 20 (in the side of an optical disk 7) and the back face 21 of the transparent substrate 2, respectively. Reflective layers 11b and 11a can be formed of a metal layer made of Ag, Al, Au or the like, or of dielectric multilayer film, respectively. In the transparent substrate 2, the laser light emitted from the semiconductor laser chip is reflected by the reflective layers 11a and 11b, and is propagated in a zigzag manner between the surface 20 and the back face 21. Any material may be used as the transparent substrate 2 as long as it is transparent with respect to the wavelength of the used laser. Particularly, a glass substrate of quartz, BK7 or the like which is stable from the standpoint of thermal properties, is favorable for the transparent substrate 2.

A silicon substrate 13 is formed on the left portion of the back face 21 of the transparent substrate 2. The silicon substrate 13 can be located above the back face 21 of the transparent substrate 2. The silicon substrate 13 having, for example, a thickness of 400 μm, a width of 5 mm, and a length of 3 mm, is integrally bonded to the transparent substrate 2 by means of, for example, flip chip bonding or a UV-curing resin (UV-curing agent). The silicon substrate includes an oblique surface 23 on which the semiconductor laser chip is located. The oblique surface 23 is inclined with respect to the back face 21 of the transparent substrate 2.

Figure 2A:
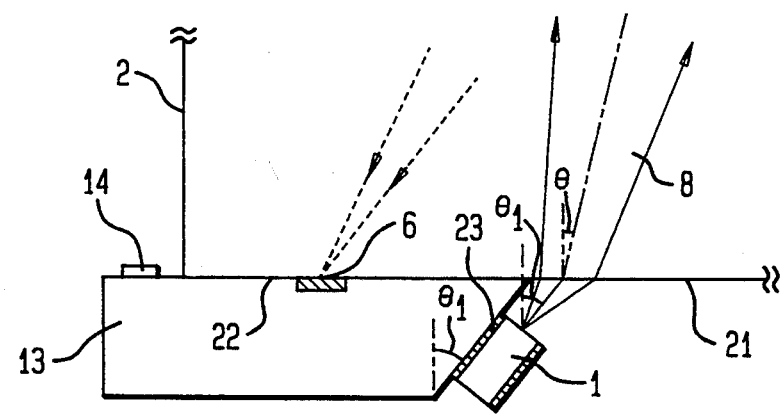
FIG. 2A is a cross-sectional view showing the silicon substrate of the first example of this invention.
Figure 2B:
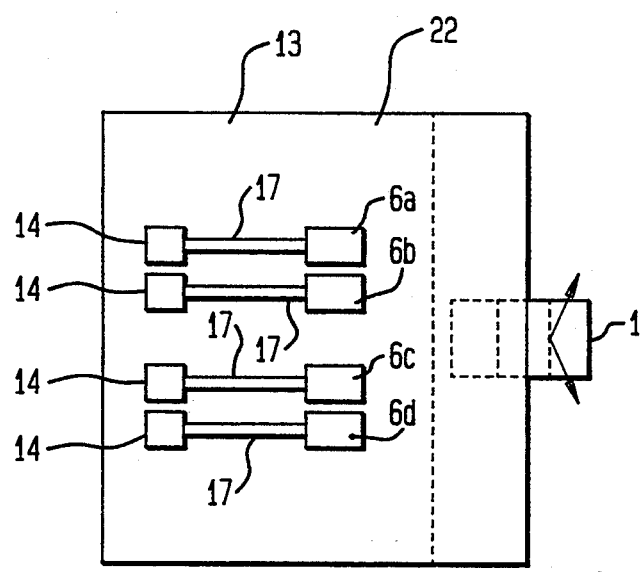
FIG. 2B is a top view of the silicon substrate of the first example of this invention.

As shown in FIGS. 2A and 2B, a light detector including two sets of two-split optical detectors 6a, 6b, 6c, and 6d, is formed on a face 22 of the silicon substrate 13. The face 22 of the silicon substrate 13 opposes the transparent substrate 2 and is parallel to the back face 21 of the transparent substrate 2. The face 22 of the silicon substrate 13 includes a first portion which is in contact with the back face 21 of the transparent substrate 2, and includes a second portion which is not in contact with the back face 21. The optical detectors 6a, 6b, 6c, and 6d output signals corresponding to the input light. The signals output from the optical detectors 6a, 6b, 6c, and 6d includes a reproduced signal and a focus/tracking error signal.

The signals output from the optical detectors 6a, 6b, 6c, and 6d are sent to terminal pads 14 through terminal lines 17. The terminal pads 14 are formed on the second portion of the face 22 of the silicon substrate 13 in such a manner that the region for the terminal pads 14 does not overlap with the transparent substrate 2. According to this configuration, signals from the optical detectors 6 formed on the silicon substrate 13 can be easily output from the terminal pads 14. A calculation circuit which can process the signals from the optical detectors 6 may be formed on the silicon substrate 13. In this case, external circuits can be reduced so that the optical head is structured in a more compact size.

The silicon substrate 13 can be made of a single-crystal silicon having a (100) plane. The (100) plane may be used as the face 22 of the silicon substrate 13. The obique surface 23 of the silicon substrate 13 is obtained using the following manners.

The silicon was subjected to an etching process (anisotropic etching) for, e.g., several hours or more by using, for example, an alkali solution such as KOH, EDP, or hydrazine, thereby forming an oblique surface 23 which is a (111) plane and is inclined with respect to the vertical direction (with respect to the (100) plane) at an angle of, for example, $\theta 1 = 35.3°$. In this etching process, the whole of the surface (face 22 on which the optical detectors 6a, 6b, 6c, and 6d are formed) of the silicon substrate 13 is masked by a resist or the like, and the back face is similarly masked by a resist to the area extending to a position where the desired slope intersects with the back face. The single-crystal silicon having the (100) plane used in the example, can be easily obtained economically. The inventors have found that, since the single-crystal silicon having (100) plane has a slope angle $\theta 1$ of 35.3°, the single-crystal silicon is suitable for a substrate on which a light source of a plate type integrated optical device is mounted. A face which is inclined with respect to the (100) plane can be used for the face 22 of the silicon substrate, thereby a desired angle of the oblique surface 23 with respect to the face 22 can be obtained.

As a result of this anisotropic etching, the oblique surface 23 having an accurate oblique angle is formed on the silicon substrate 13 with excellent reproducibility. The chip of the semiconductor laser device 1 is mounted on the oblique surface 23 using, for example, indium. Since the silicon has excellent heat conductivity which is superior by two orders of magnitude over that of glass, the silicon substrate 13 is suitable as a heat sink for the semiconductor laser chip 1. Therefore, the heat of the semiconductor laser chip 1 is efficiently dissipated, and the output power of the semiconductor laser chip is prevented from being reduced, and a high power laser can be used. Other materials which have excellent heat conductivity can be used for the substrate on which the semiconductor laser chip 1 is mounted.

The semiconductor laser chip 1 disposed on the oblique surface 23 emits laser light having, for example, a wavelength of 0.78 μm and having an optical axis inclined from the z axis by, for example, $\theta 1 = 35.3°$. The emitted light pases through the air to enter the transparent substrate 2, and is refracted at the interface to become propagation light 8 having an optical axis inclined from the z axis by, for example, 22.5° (optical axis angle $\theta = 22.5°$). The propagation light 8 enters a reflection type collimator lens 3 which is disposed on the surface 20 of the transparent substrate 2 and which has, for example, a focal length of 3.24 mm and a size in the x direction of 1.5 mm. The collimator lens 3 reflects and collimates the propagation light 8. After the collimation and the reflection, the propagation light 8 still has the same optical axis angle of, for example, 22.5°.

The distance between the emitting end face of the semiconductor laser chip 1 and the back face 21 of the transparent substrate 2 is not zero. The emitting end face and the back face 21 are separated from each other by an appropriate prescribed distance. The laser light 8 oscillated by the semiconductor laser chip 1 is a divergent spherical wave which is inclined, thereby attaining an effect that the astigmatism of the oscillation light can be reduced.

The reflection collimator lens 3 includes elliptical gratings having a saw-tooth like section shape in which the spaces between the adjacent gratings becomes smaller in a direction from the inside to the outside of the gratings. The center positions of the elliptical gratings are gradually shifted toward the outer periphery in the y direction. The collimator lens having such a structure so as to eliminate coma-aberration and astigmatism which are usually caused by an oblique incidence, resulting in the collimating being satisfactorily conducted.

The collimated light having a width of 1.5 mm propagates in a zigzag manner and passes through a reflection twin lens 5 which is disposed on the transparent substrate 2. The reflection twin lens 5 reflects the propagation light 8, and the transmission light (zero-order diffracted light) from the reflection twin lens 5 is converged on a reflective object such as an optical disk 7, by a transmission objective lens 4. The transmission objective lens 4 functions as the optical converging element and which has, for example, an aperture of 1.5 mm and a focal length of 1.5 mm, and then vertically emits and converges the laser light as an emitted light 9 to the optical disk 7. Light 10 reflected from the optical disk 7 enters a transmission objective lens 4 and is collimated to become propagation light 8'. The propagation light 8' propagates in a zigzag manner and enters a reflection twin lens 5 which is formed on the transparent substrate 2 and functions as the signal detecting element (focus/track error signal detecting element). For example, the reflection twin lens 5 has a size of 1.5 mm in the x direction, a size of 1.5 mm in the y direction, and a focal length of 10.6 mm. The reflection twin lens 5 has a configuration wherein two reflection lenses 5a and 5b which consist of curved gratings and have the same specification are arranged so as to form an array. First-order diffracted light of the propagation light 8' is split into two parts by the reflection twin lens 5 and propagates in a zigzag manner at a propagation angle of, for example, 32° of the optical axis, to be converged into an optical detector 6.

The reflection collimator lens 3 is an inline reflection diffractive optical lens having a maximum groove depth of, for example, 0.28 μm. The transmission objective lens 4 is an off-axis transmission diffractive optical lens having a maximum groove depth of, for example, 1.3 μm. The reflection twin lens 5 is an off-axis type and has a maximum groove depth of, for example, 0.1 μm. All the four optical elements are diffractive optical elements which converge light by means of the diffraction phenomenon of light. In the invention, the term in-line diffractive optical lens means a lens in which the optical axis angle of incident light is coincident with that of emitted light, and the term off-axis diffractive optical lens means a lens in which the optical axis angle of incident light is different from that of emitted light. The use of the diffractive optical elements enables the lens thickness to be reduced to several μm at the most, and allows the following further effects to be attained. Namely, accurate positioning and integration can be conducted on the transparent substrate 2 by using the known planar technique, and the optical head can be miniaturized, lightened, and stabilized.

For example, the diffractive optical elements 3, 4, and 5 were formed by coating an electron beam resist such as PMMA, CMS, or the like, on the transparent substrate, conducting an electron-beam writing in which the irradiation amount is controlled depending on the film thickness of an element to be produced, and then conducting a developing process to change the thickness of the resist. A mold was produced from the thus produced optical element (original) by, for example, a nickel electroforming method, and the lenses 3, 4 and 5 identical with those of the original were duplicated on the transparent substrate 2 using, for example, a UV-curing resin. According to this method, three diffractive optical lenses 3, 4, and 5 can easily be formed by one process on the transparent substrate 2 with excellent positional accuracy and the same properties. After the process of duplicating the reflection type diffractive optical lenses 3 and 5, a metal layer such as Ag, Al, or Au is deposited on them as a reflective layer 11b.

On the reflective layer 11b, a metal layer such as Cu, or Cr, a synthetic resin such as a UV-curing resin, or lacquer, a dielectric multilayer film, SiO, $SiO_2$, $MgF_2$, SiC, graphite, diamond, or the like is deposited in a thickness of 1,000 Å to several μm. This configuration enables the surface of the reflective layer to be hard to scratch, and protects the reflective layer from being oxidized, thereby improving the properties against the environment. Particularly, in the case where the reflective layer was made of Ag, which is hardly oxidized, the effect was remarkable.

Signals recorded on the optical disk 7 are reproduced from a sum of the outputs ($6a+6b+6c+6d$) of the split optical detectors 6a, 6b, 6c, and 6d.

The focus error signal and the track error signal are detected by using the position signal detecting element 5. In the detection of the focus error signal, the known Foucault method was used. Specifically, when the optical disk 7 is at a just-focus position, the two split propagation light beams obtained by the reflection twin lens 5 are respectively converged at the middles of the split optical detectors 6a and 6b, and 6c and 6d. The focus error signal is obtained as a difference between the outputs of the optical detectors 6a and 6b ($6a-6b$), or a difference between the outputs of the optical detectors 6d and 6c ($6d-6c$). When the optical disk 7 is at the just-focus position, the level of the focus error signal is zero. When the optical disk 7 is deviated from the just-focus position in the −z direction, the propagation light 8' is changed from a parallel wave to a converging spherical wave. Therefore, the two split propagation light beams move so as to approach each other, resulting in that the focus error signal becomes negative. In contrast, when the optical disk 7 is deviated from the just-focus position in the z direction so as to move nearer, the propagation light 8' is changed to a diverging spherical wave. Therefore, the two split propagation light beams move so as to separate from each other, resulting in the focus error signal becoming positive.

Depending on the focus error signal, accordingly, focus control can be conducted.

The track error signal can be detected by the known push-pull method using a difference between the optical powers of the two split propagation light beams, that is, a calculation result ($6a+6b-6c-6d$) of the outputs of the optical detectors. When the calculation result is zero, the just tracking is obtained. When the calculation result is not zero, the tracking is deviated. Depending on this signal, track control can be conducted.

Focus control and track control are conducted on the basis of the detected respective error signals, by moving the whole of the transparent substrate 2 on which the optical elements are disposed, by means of an actuator to the optimum position.

In the optical device of the invention, the transparent substrate 2 has a width and thickness which are in the order of, for example, 500 or more times the wavelength of the laser light. These values are set depending on the sizes of the optical elements 3, 4, and 5, and allow the optical device to be treated in geometrical optics in which light propagates in the form of a beam in a zigzag manner.

EXAMPLE 2

Figure 3A:
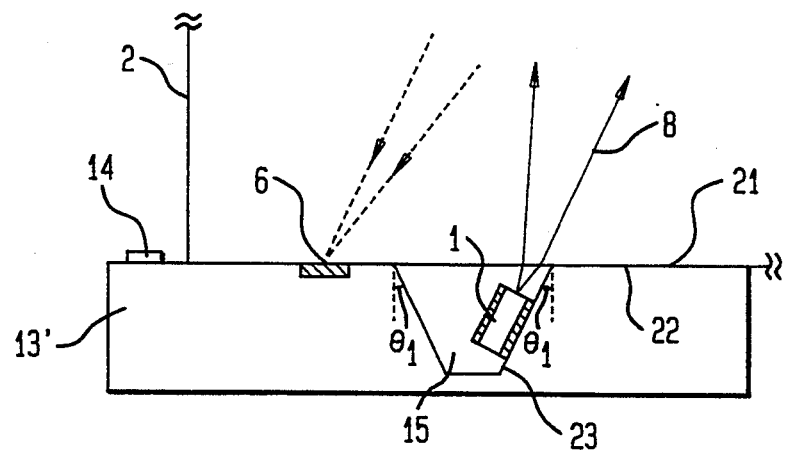
FIG. 3A is a cross-sectional view showing the silicon substrate of the second example of this invention.
Figure 3B:
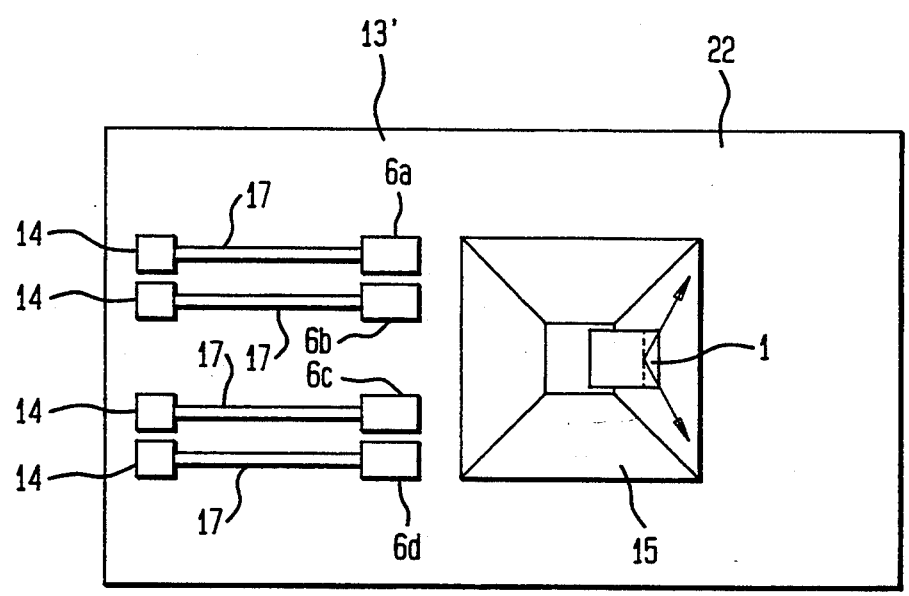
FIG. 3B is a top view of the silicon substrate of the second example of this invention.

FIG. 3A is a cross-sectional view showing a silicon substrate used in an optical device of the second example of this invention, and FIG. 3B is a top view of the silicon substrate of the second example. The optical device of the second example of the invention is also an optical head for reading out signals from an optical recording medium. The optical device of the second example of the invention is identical with that of the first example except for the structure of the silicon substrate. Therefore, only the silicon substrate of the example will be described.

In the silicon substrate 13' of the example, the optical detector 6, the terminal pads 14, and terminal lines 17 are formed on the face 22 of the silicon substrate, and an inverted pyramid-like concave portion 15 is formed in the right portion of the silicon substrate by an anisotropic etching. The inverted pyramid-like concave portion 15 has an opening which faces the back face 21 of the transparent substrate 2. The semiconductor laser chip 1 is disposed on the oblique surface 23 which is one of the oblique side faces of the concave portion 15. The face 22 on which the concave portion 15 is formed opposes the transparent substrate 2, and the silicon substrate 13' is bonded to the transparent substrate 2 in such a manner that the concave portion 15 is hermetically sealed, thereby obtaining an integrated structure. According to this structure wherein the silicon substrate 13' is integrated with the transparent substrate 2 so as to hermetically seal the concave portion 15 in which the semiconductor laser chip 1 is located, the semiconductor laser chip is prevented from being affected by moisture and dust of the external environment, whereby the properties against the environment of the semiconductor laser chip 1 is improved. The formation of the concave portion 15 is conducted by masking the whole of the silicon substrate 13' by, for example, a resist, then opening the portion of the mask which corresponds to the size of the concave portion 15, and then conducting an anisotropic etching in the same manner as the first example. In this case, the four oblique side faces of the concave portion 15 are formed with excellent reproducibility and at a slope angle $\theta 1$ of, for example, 35.3°.

EXAMPLE 3

Figure 4A:
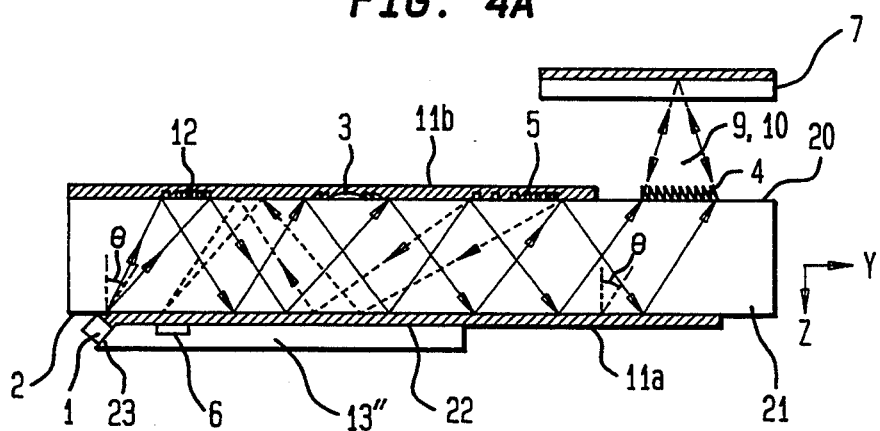
FIG. 4A is a cross-sectional view showing the construction of the third example of this invention, and illustrating the propagation and the convergence of the laser light in the third example.
Figure 4B:
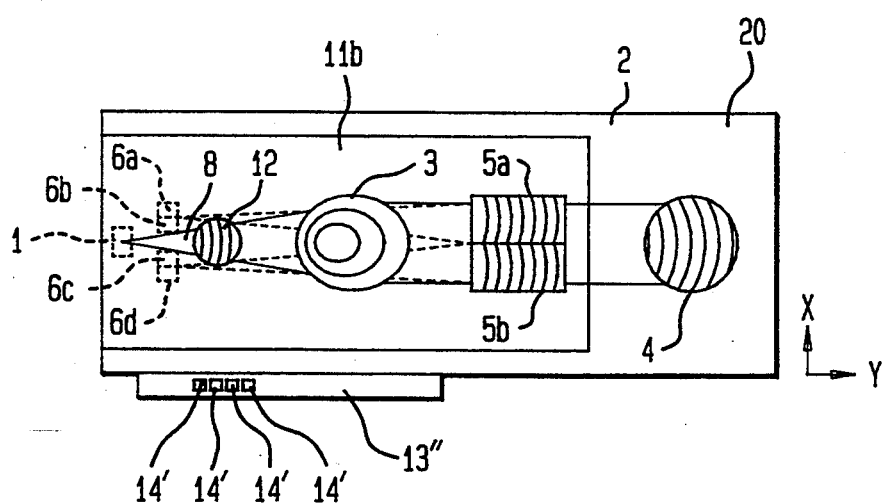
FIG. 4B is a top view of the third example of this invention, showing the construction of the third example, and illustrating the propagation and the convergence of the laser light in the third example.

FIG. 4A is a cross-sectional view showing an optical device of the third example of the invention, and FIG. 4B is a top view of the third example. The optical device of the third example of the invention is also an optical head for reading out signals from an optical recording device. Hereinafter, only the points of the optical device of the third example of the invention which are different from those of the optical device of the first example will be described. The optical device of the third example is different mainly in that the semiconductor laser chip 1 is mounted at a position separated from the optical detector 6 in the −y direction, and that a wavelength selection lens 12 for preventing the wavelength of the semiconductor laser chip 1 from varying is formed on the surface 20 of the transparent substrate 2.

The wavelength selection lens 12 includes curved gratings having a rectangular cross section in which the spaces between the adjacent gratings are gradually reduced in the y direction. Incident light is reflected and diffracted at a diffraction efficiency of, for example, 15%, and only the diffracted light of a selected wavelength (for example, 0.780 μm) is converged to enter the emitting end face of the semiconductor laser chip 1. First-order diffracted light of other wavelengths (for example, 0.77 to 0.79 μm) is out of focus on the emitting end face, and the amount of incident light is further decreased as the wavelength is different from the selected wavelength. The amount of incident light depends on the reflectivity of the emitting end face. In the example, for example, the amount of incident light is set to be 5 to 20% of the total amount of the oscillation light. This produces an effect that, when the amount of incident light is set so as to be substantially greater than the reflectivity (for example, 5%) of the emitting end face, the laser oscillation wavelength is fixed at the selected wavelength, and the wavelength variation is suppressed to about 0.2 nm. In the example, the first-order diffracted light is used to fix the wavelength. Diffracted light of another order such as second-order may be used.

The reflection light (zero-order diffracted light) of the wavelength selection lens 12 propagates through the transparent substrate 2 in a zigzag manner, and enters the reflection collimator lens 3 disposed on the transparent substrate 2. Thereafter, the light propagation process is conducted in the same manner as the optical device of the first example.

The configuration in which the left end face of the silicon substrate 13" of the example is formed as the oblique surface 23 and the semiconductor laser chip 1 is mounted at a position separated from the optical detector 6 in the −y direction, enables the area of the silicon substrate 13" which functions as a heat sink, to be extended in the rightward direction (y direction), thereby dissipating heat with further excellent efficiency. In the example, the reflective layer 11a covers substantially the whole area of the back face 21 of the transparent substrate 2, and the reflective layer 11a includes openings at positions respectively corresponding to the light emission position of the semiconductor laser chip 1 and the light receiving position of the optical detector 6. The laser light emitted from the semiconductor laser chip 1 passes through one of the openings, and the light converged into the optical detector 6 passes through the other opening. The silicon substrate 13" is contacted with the reflective layer 11a so as to overlap therewith. The silicon substrate 13" is disposed on an opposite side of the reflective layer 11a with respect to the transparent substrate 2. The heat generated in the semiconductor laser chip 1 is dissipated to the outside through the silicon substrate 13" and also the reflective layer 11a which has a larger area, and therefore the efficiency of the heat sink is excellent. Conversely speaking, the configuration in which the silicon substrate 13" is contacted with the reflective layer 11a reduces the volume and the total weight of the optical device, with the result that the operation speed of an actuator can be accelerated.

The terminal pads 14' are formed in the region in the front edge (−x edge) of the silicon substrate 13" so as to be exposed from the back face 21 to the outside.

EXAMPLE 4

Figure 5A:
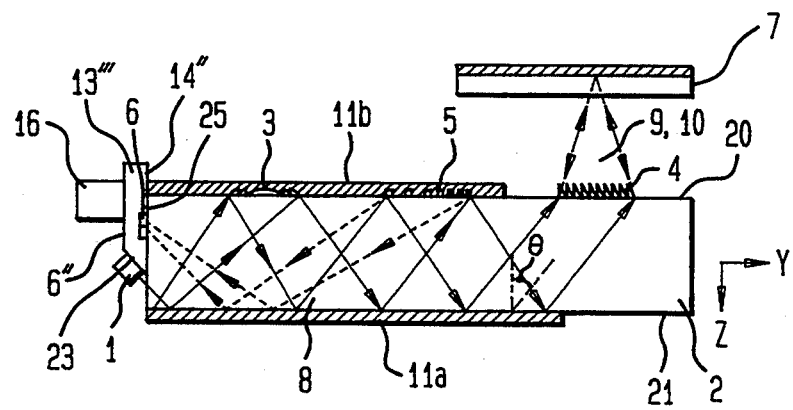
FIG. 5A is a cross-sectional view showing the construction of the fourth example of this invention, and illustrating the propagation and the convergence of the laser light in the fourth example.
Figure 5B:
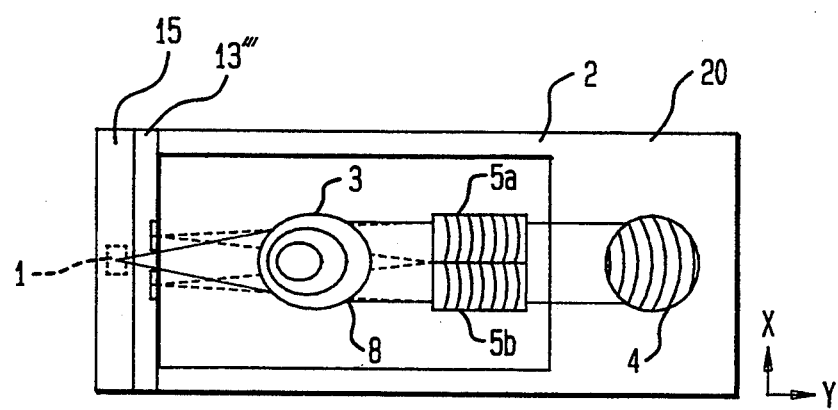
FIG. 5B is a top view of the fourth example of this invention, showing the construction of the fourth example, and illustrating the propagation and the convergence of the laser light in the fourth example.
Figure 6A:
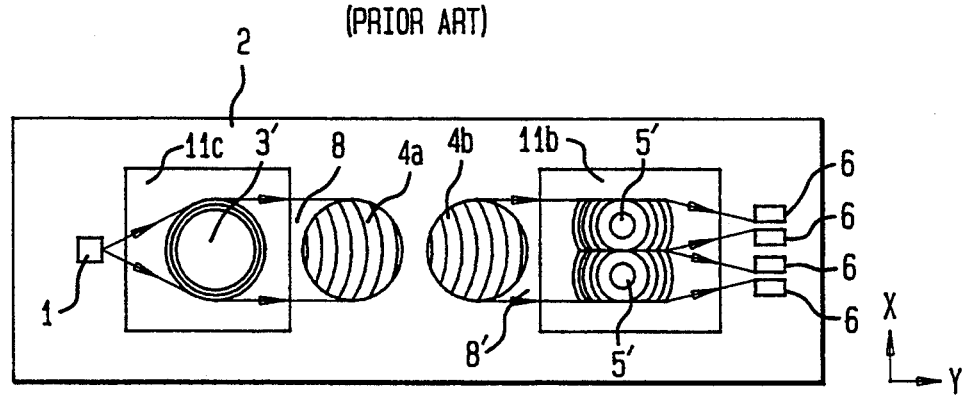
FIG. 6A is a cross-sectional view showing the conventional optical device.
Figure 6B:
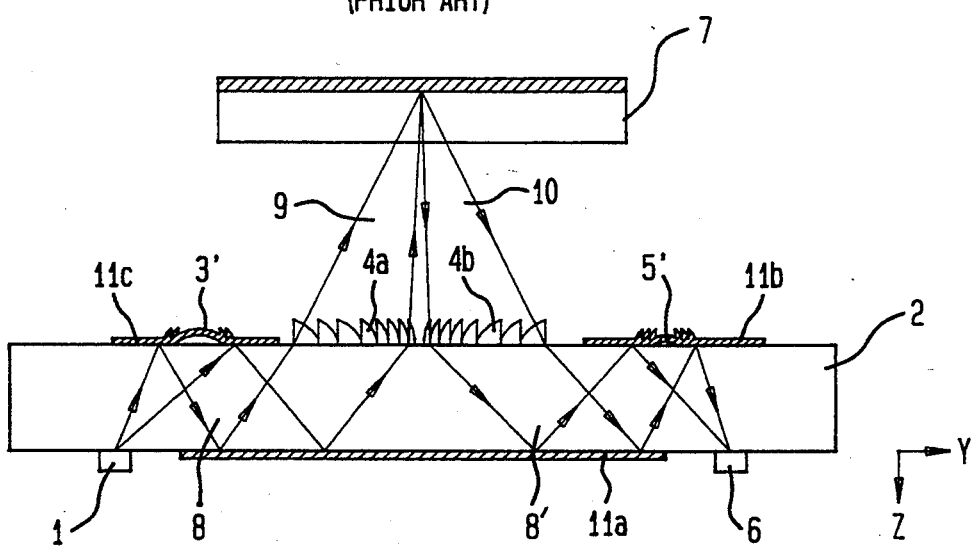
FIG. 6B is a top view of the conventional optical device.

FIG. 5A is a cross-sectional view showing the optical device of a fourth example of the invention, and FIG. 5B is a top view of the fourth example. The optical device of the fourth example of the invention is also an optical head for reading out signals from an optical recording device.

Hereinafter, only the configuration of the fourth example which is different from that of the optical device of the first example will be described. The optical device of the fourth example is different in that the silicon substrate 13''' is not disposed on the back face 21 of the transparent substrate 2 but disposed on the left end face 25. The left end face 25 is substantially perpendicular to the surface 20 and the back face 21 of the transparent substrate 2. The oblique surface 23 of the silicon substrate 13''' on which the semiconductor laser chip 1 is disposed, is inclined with respect to the left end face 25. The disposition of the silicon substrate on the end face 21 of the transparent substrate 2 can decrease the thickness of the optical device. In the example, since the volume of the silicon substrate 13''' cannot be set to be large, a copper block 16 is contacted with the silicon substrate 13''' so that the efficiency of the heat sink is enhanced. An optical detector 6" is disposed on the copper block 16 to detect light emitted from the emitting end face of the semiconductor laser chip 1. The detected light is used in the output control of oscillation light of the semiconductor laser chip 1.

The examples of the optical device of the invention have been described. In addition to the optical devices of the examples, other optical devices may be configured by combining the structures of these optical devices, while attaining the same effects. The term "objective lens" and "collimator lens" used in the first to fourth examples are used for the convenience of illustration, and are the same as lenses which are usually used. Optical heads for optical disk apparatuses have been described in the above examples, the same effects can be attained even when the invention is applied to a plate type integrated optical device for another type optical recording medium.

According to the invention, it is possible to realize a optical device in which the incident angle of the laser light emitted from the semiconductor laser chip can accurately be set.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical device comprising:
   a semiconductor laser chip having an emitting end face for emitting laser light;
   a transparent substrate, allowing said laser light to transmit therethrough, having a first surface, and having a second surface facing said first surface; and
   a substrate, located abutting said transparent substrate, having an oblique surface inclined with respect to said second surface, and having a parallel surface parallel to said second surface;
   wherein said semiconductor laser chip is located on said oblique surface of said substrate; and
   said laser light emitted from said semiconductor laser chip propagates through said transparent substrate in a zigzag manner between said first surface and said second surface.

2. An optical device according to claim 1, wherein said substrate is made of silicon.

3. An optical device according to claim 1, wherein said substrate is located directly on said transparent substrate.

4. An optical device according to claim 1, further comprising a light detector formed on said parallel surface of said silicon substrate, wherein said light detector detects said laser light propagated through said transparent substrate, and generates an electric signal corresponding to said detected laser light.

5. An optical device according to claim 4, further comprising;
   a first optical element, formed on said transparent substrate, for collimating and reflecting said laser light;
   a second optical element, formed on said transparent substrate, for converging said laser light collimated by said first optical element on an object which exists outside said transparent substrate;
   a third optical element, formed on said transparent substrate, for converging said laser light reflected by said object on said light detector; and
   a reflective layer, formed on said transparent substrate, for reflecting said laser light.

6. An optical device according to claim 5, wherein said parallel surface of said substrate has a first portion being in contact with said second surface of said transparent substrate, and has a second portion not being in contact with said second surface, and terminal pads, for outputting said electric signal generated by said light detector, are formed on said second portion of said parallel surface.

7. An optical device according to claim 5, wherein said object is an optical recording medium.

8. An optical device according to claim 1, wherein the distance between said first surface and said second surface of said transparent substrate is 500 or more times the wavelength of said laser light.

9. An optical device according to claim 1, wherein the width of said transparent substrate is 500 or more times the wavelength of said laser light.

10. An optical device according to claim 2, wherein said oblique surface of said substrate is formed by anisotropic etching.

11. An optical device according to claim 10, wherein said substrate is made of a single-crystal silicon having a (100) plane, and said parallel surface of said substrate includes said (100) plane.

12. An optical device according to claim 1, wherein said emitting end face of said semiconductor laser chip is located apart from said second surface of said transparent substrate by a prescribed distance.

13. An optical device according to claim 1, wherein said oblique surface of said substrate is inclined at 35.3° to a surface perpendicular to said second surface of said transparent substrate.

14. An optical device according to claim 2, wherein said substrate includes a concave portion having a inverted pyramid-like shape and having an opening which faces said second surface of said transparent substrate, and said oblique surface of said substrate is a portion of said concave portion.

15. An optical device according to claim 14, wherein said concave portion of said substrate is formed by anisotropic etching.

16. An optical device according to claim 5, wherein said substrate is disposed on an opposite side of said reflective layer with respect to said transparent substrate.

17. An optical device according to claim 16, wherein said reflective layer has an opening through which said laser light emitted from said semiconductor laser chip passes.

18. An optical device comprising:
 a semiconductor laser chip having an emitting end face for emitting laser light;
 a transparent substrate, allowing said laser light to transmit therethrough, having a first surface, a second surface facing said first surface, and a third surface substantially perpendicular to said second surface; and
 a silicon substrate, located on said transparent substrate, having an oblique surface inclined with respect to said third surface, and having a parallel surface parallel to said third surface;
 wherein said oblique surface of said silicon substrate is formed by anisotropic etching;
 said semiconductor laser chip is located on said oblique surface of said silicon substrate; and
 said laser light emitted from said semiconductor laser chip propagates through said transparent substrate in a zigzag manner between said first surface and said second surface.

19. An optical device comprising:
 a semiconductor laser chip having an emitting end face for emitting laser light;
 a transparent substrate, allowing said laser light to transmit therethrough, having a first surface and a second surface facing said first surface;
 a silicon substrate, located on said transparent substrate, having an oblique surface inclined with respect to said second surface, and having a parallel surface parallel to said second surface; and
 a light detector formed on said parallel surface of said silicon substrate, for detecting said laser light propagated through said transparent substrate, and for generating an electric signal corresponding to said detected laser light,
 wherein said oblique surface of said silicon substrate is formed by anisotropic etching;
 said semiconductor laser chip is located on said oblique surface of said silicon substrate; and
 said laser light emitted from said semiconductor laser chip propagates through said transparent substrate in a zigzag manner between said first surface and said second surface.

20. An optical device comprising:
 a semiconductor laser chip having an emitting end face for emitting laser light;
 a transparent substrate, allowing said laser light to transmit therethrough, having a first surface, and having a second surface facing said first surface;
 a light detector for detecting said laser light and generating an electric signal corresponding to said detected laser light;
 a silicon substrate, located on said transparent substrate, having an oblique surface inclined with respect to said second surface, and having a parallel surface parallel to said second surface; and
 a first optical element, formed on said first surface of said transparent substrate, for collimating and reflecting said laser light;
 a second optical element, formed on said first surface of said transparent substrate, for converging said laser light collimated by said first optical element on an object which exists outside said transparent substrate;
 a third optical element, formed on said first surface of said transparent substrate, for converging said laser light reflected by said object on said light detector; and
 a reflective layer, formed on said second surface of said transparent substrate, for reflecting said laser light,
 wherein said semiconductor laser chip is located on said oblique surface of said silicon substrate; and
 said light detector is formed on said parallel surface of said silicon substrate.

* * * * *